US012170263B2

(12) United States Patent
Saleh et al.

(10) Patent No.: US 12,170,263 B2
(45) Date of Patent: Dec. 17, 2024

(54) FABRICATING ACTIVE-BRIDGE-COUPLED GPU CHIPLETS

(71) Applicant: ADVANCED MICRO DEVICES, INC., Santa Clara, CA (US)

(72) Inventors: Skyler J. Saleh, San Diego, CA (US); Ruijin Wu, San Diego, CA (US); Milind S. Bhagavat, Santa Clara, CA (US); Rahul Agarwal, Santa Clara, CA (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 16/585,480

(22) Filed: Sep. 27, 2019

(65) Prior Publication Data

US 2021/0098419 A1    Apr. 1, 2021

(51) Int. Cl.
*H01L 23/00* (2006.01)
*G06F 8/41* (2018.01)
*H01L 21/48* (2006.01)
*H01L 21/56* (2006.01)
*H01L 21/683* (2006.01)
(Continued)

(52) U.S. Cl.
CPC .............. *H01L 24/96* (2013.01); *G06F 8/451* (2013.01); *H01L 21/4846* (2013.01); *H01L 21/563* (2013.01); *H01L 21/568* (2013.01); *H01L 21/6835* (2013.01); *H01L 24/19* (2013.01); *H01L 24/97* (2013.01); *H01L 25/50* (2013.01); *H01L 2021/6006* (2013.01);
(Continued)

(58) Field of Classification Search
CPC ............. H01L 25/0657; H01L 25/0655; H01L 21/6835; H01L 21/568; H01L 21/563; H01L 24/19; H01L 24/96; H01L 24/97; H01L 2224/0231
See application file for complete search history.

(56) References Cited

U.S. PATENT DOCUMENTS 8,860,741 B1    10/2014   Juffa et al.
10,282,811 B2    5/2019   Ray et al.
(Continued)

FOREIGN PATENT DOCUMENTS

CN    108694688    10/2018
CN    108732754    11/2018
(Continued)

OTHER PUBLICATIONS

Final Office Action issued May 17, 2021 in U.S. Appl. No. 16/456,287, 8 pages.
(Continued)

*Primary Examiner* — Dale E Page
*Assistant Examiner* — Wilner Jean Baptiste

(57) ABSTRACT

Various multi-die arrangements and methods of manufacturing the same are disclosed. In some embodiments, a method of manufacture includes a face-to-face process in which a first GPU chiplet and a second GPU chiplet are bonded to a temporary carrier wafer. A face surface of an active bridge chiplet is bonded to a face surface of the first and second GPU chiplets before mounting the GPU chiplets to a carrier substrate. In other embodiments, a method of manufacture includes a face-to-back process in which a face surface of an active bridge chiplet is bonded to a back surface of the first and second GPU chiplets.

19 Claims, 6 Drawing Sheets

(51) Int. Cl.
*H01L 25/00* (2006.01)
*H01L 25/065* (2023.01)
*H01L 21/60* (2006.01)

(52) U.S. Cl.
CPC .. *H01L 25/0657* (2013.01); *H01L 2224/0231* (2013.01); *H01L 2224/11002* (2013.01)

(56) References Cited

U.S. PATENT DOCUMENTS

| | | | |
|---|---|---|---|
| 10,475,147 | B2 | 11/2019 | Price et al. |
| 10,803,548 | B2 | 10/2020 | Matam et al. |
| 2001/0005873 | A1 | 6/2001 | Yasuda et al. |
| 2007/0273699 | A1 | 11/2007 | Sasaki et al. |
| 2011/0072213 | A1 | 3/2011 | Nickolls et al. |
| 2011/0087864 | A1 | 4/2011 | Duluk, Jr. et al. |
| 2012/0330802 | A1 | 12/2012 | Guthrie et al. |
| 2013/0286034 | A1 | 10/2013 | Diard |
| 2014/0001645 | A1* | 1/2014 | Lin .................... H01L 25/0657 257/E23.079 |
| 2014/0176187 | A1* | 6/2014 | Jayasena ............ G06F 15/7867 326/39 |
| 2015/0243528 | A1 | 8/2015 | Whiting et al. |
| 2017/0062383 | A1* | 3/2017 | Yee ...................... H01L 21/486 |
| 2017/0236244 | A1 | 8/2017 | Price et al. |
| 2017/0365580 | A1* | 12/2017 | Shih .................. H01L 25/0652 |
| 2018/0102251 | A1* | 4/2018 | Delacruz .............. H01L 21/743 |
| 2018/0102338 | A1 | 4/2018 | Mclellan |
| 2018/0130751 | A1 | 5/2018 | Bower |
| 2018/0233470 | A1 | 8/2018 | Killer et al. |
| 2018/0246814 | A1 | 8/2018 | Jayasena et al. |
| 2018/0293205 | A1 | 10/2018 | Koker et al. |
| 2018/0300098 | A1 | 10/2018 | Vembar et al. |
| 2018/0366436 | A1 | 12/2018 | Wang et al. |
| 2019/0051633 | A1* | 2/2019 | Bhagavat ............ H01L 23/5385 |
| 2019/0089036 | A1 | 3/2019 | Kamgaing et al. |
| 2019/0123022 | A1 | 4/2019 | Teig et al. |
| 2019/0221556 | A1 | 7/2019 | Gomes et al. |
| 2019/0245582 | A1 | 8/2019 | Burton |
| 2020/0176384 | A1* | 6/2020 | Wu ...................... H01L 21/4857 |
| 2020/0294181 | A1* | 9/2020 | Matam ...................... G06T 1/20 |
| 2021/0020602 | A1* | 1/2021 | Chen ........................ H01L 23/13 |

FOREIGN PATENT DOCUMENTS

| | | |
|---|---|---|
| EP | 3385848 | 10/2018 |
| EP | 3511980 | 7/2019 |
| JP | 2011523745 | 12/2009 |
| JP | 2015524979 | 2/2014 |
| WO | 2012137339 | 10/2012 |
| WO | 2019032322 A1 | 2/2019 |
| WO | 2019132971 | 4/2019 |

OTHER PUBLICATIONS

Notice of Allowance issued Jun. 10, 2021 in U.S. Appl. No. 16/698,624, 9 pages.
Non-Final Office Action for U.S. Appl. No. 16/456,287 dated Sep. 11, 2020, 19 pages.
International Search Report and Written Opinion for PCT/US2020/039326 dated Oct. 13, 2020, 10 pages.
Jieming Yin et al., "Modular Routing Design for Chiplet-based Systems", pp. 726-738, 2018 [retrieved on Oct. 5, 2019]. Retrieved from <URL: https://www.eecg.utoronto.ca/~enright/modular-isca.pdf>.
Akhil Arunkumar et al., "MCM-GPU: Multi-Chip-Module GPUs for Continued Performance Scalability", 2017 [retrieved on Oct. 5, 2019]. Retrieved from <URL: https://research.nvidia.com/sites/default/files/publications/ISCA_2017_MCMGPU.pdf>.
U.S. Appl. No. 16/456,287, filed Jun. 28, 2019 in the name of Skyler J. Saleh, et al.
U.S. Appl. No. 16/585,452, filed Sep. 27, 2019 in the name of Skyler J. Saleh, et al.
U.S. Appl. No. 16/698,624, filed Nov. 27, 2019 in the name of Skyler J. Saleh, et al.
Non-Final Office Action issued Jan. 4, 2021 in U.S. Appl. No. 16/585,452, 25 pages.
International Search Report and Written Opinion issued Dec. 30, 2020 in Application No. PCT/US2020/052433, 12 pages.
Burd, Thomas, et al., "'Zeppelin': An SoC for Multichip Architectures", IEEE Journal of Solid-State Circuits, vol. 54, No. 1, Jan. 2019, pp. 133-143.
International Search Report and Written Opinion issued Dec. 30, 2020 in Application No. PCT/US2020/052444, 12 pages.
Non-Final Office Action issued Nov. 13, 2020 in U.S. Appl. No. 16/698,624, 40 pages.
International Preliminary Report on Patentability mailed Apr. 7, 2022 for PCT/US2020/052444, 8 pages.
Non-Final Office Action issued Dec. 22, 2021 in U.S. Appl. No. 16/585,452, 11 pages.
International Preliminary Report on Patentability issued Dec. 28, 2021 for PCT/US20/039326, 6 pages.
Final Office Action issued Jul. 30, 2021 in U.S. Appl. No. 16/585,452, 12 pages,.
Notice of Allowance issued Sep. 15, 2021 in U.S. Appl. No. 16/698,624, 18 pages.
Non-Final Office Action mailed Apr. 28, 2022 for U.S. Appl. No. 16/456,287, 8 pages.
International Preliminary Report on Patentability mailed Mar. 15, 2022 for PCT/US2020/052433, 9 pages.
Notice of Allowance Issued in U.S. Appl. No. 16/585,452, mailed Jul. 22, 2022, 7 pages.
Notice of Allowance mailed Jul. 31, 2023 for U.S. Appl. No. 16/456,287. 7 pages.
Japanese Office Action issued in Application No. 2022-516307, mailed Oct. 17, 2023, 4 pages.
Office Action issued in Indian Application No. 202117059190, mailed Oct. 9, 2023, 10 pages.
Extended European Search Report issued in Application No. 20832015, mailed Jun. 22, 2023, 12 Pages.
Yin, Jieming et al. "Modular Routing Design for Chiplet-Based Systems" 2018 ACM/IEEE 45th Annual International Symposium on Computer Achitecture (ISCA), IEEE, 2018, pp. 726-738.
Office Action mailed Feb. 7, 2023 for Chinese Application No. 202080067194.0, 6 pages.
Office Action issued in Korean Application No. 10-2022-7012861, mailed Feb. 14, 2024, 3 pages.
Beck et al. "'Zeppelin': an SoC for Multichip Architecture" IEEE International 2015, 3 pages.
Extended European Search Report issued in Application No. 20868658.4, mailed Sep. 27, 2023, 7 pages.
Extended European Search Report issued in Application No. 20867435.8, mailed Oct. 10, 2023, 11 pages.
Office Action issued in U.S. Appl. No. 18/204,604, mailed Dec. 8, 2023, 11 pages.
Non-final Office Action issued in U.S. Appl. No. 16/456,287, mailed Jan. 20, 2023, 8 pages.
Office Action issued in Indian Application No. 202217015275 mailed Aug. 28, 2024, 5 pages.
Office Action issued in Korean Application No. 10-2022-7011449, mailed Sep. 10, 2024, 7 pages.

* cited by examiner

FABRICATING ACTIVE-BRIDGE-COUPLED GPU CHIPLETS

BACKGROUND

Computing devices such as mobile phones, personal digital assistants (PDAs), digital cameras, portable players, gaming, and other devices requires the integration of more performance and features into increasingly smaller spaces. As a result, the density of processor dies and number of dies integrated within a single integrated circuit (IC) package have increased. Some conventional multi-chip modules include two or more semiconductor chips mounted side-by-side on a carrier substrate or in some cases on an interposer (so-called "2.5D") that is, in-turn, mounted on a carrier substrate.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

DETAILED DESCRIPTION

Figure 1:
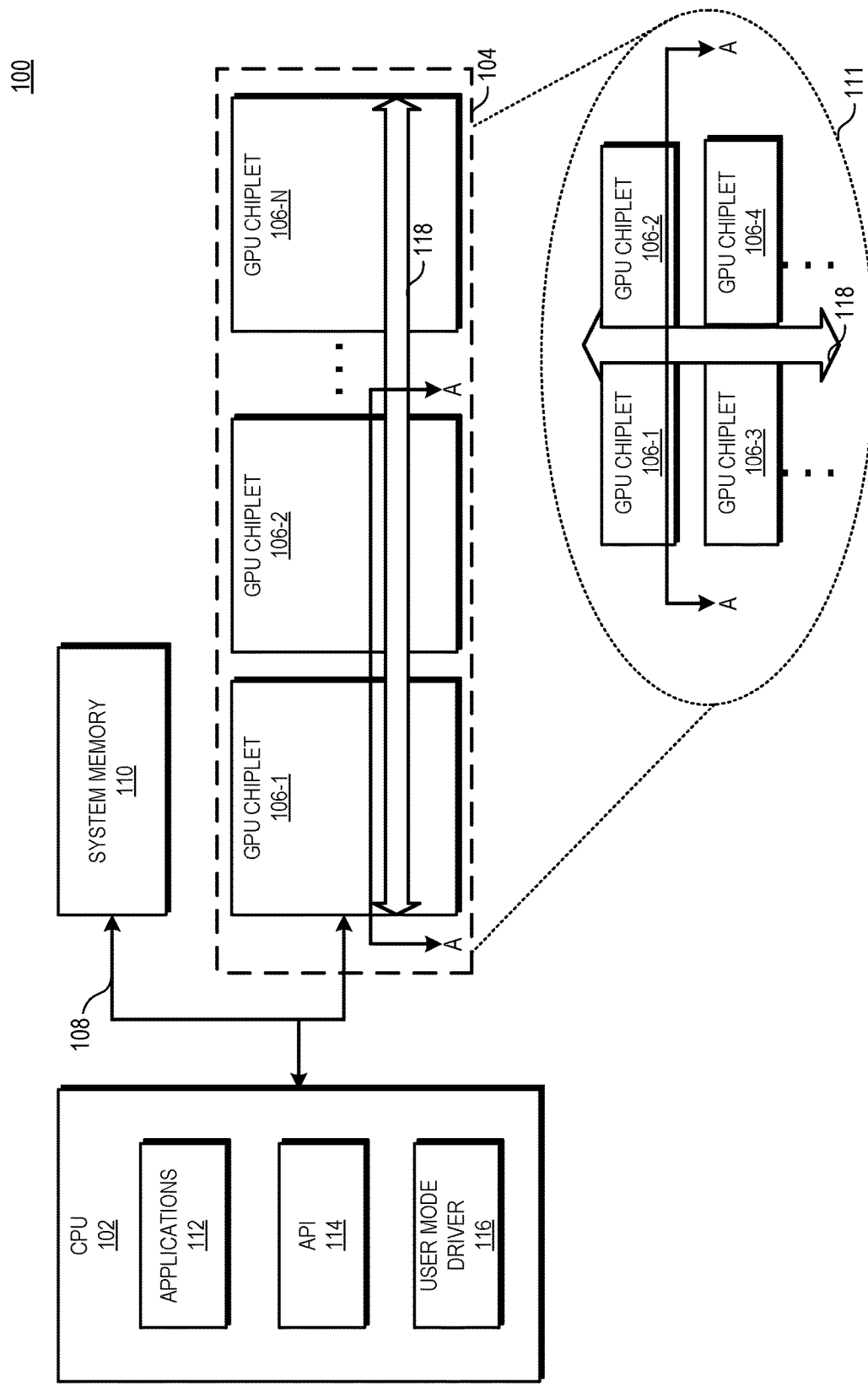
FIG. 1 is a block diagram illustrating a processing system employing active bridge chiplets for coupling GPU chiplets in accordance with some embodiments.

Conventional monolithic die designs are becoming increasingly expensive to manufacture. Chiplets have been used successfully in CPU architectures to reduce cost of manufacture and improve yields, as the heterogeneous computational nature of CPUs is more naturally suited to separate CPU cores into distinct units that do not require much inter-communication. In contrast, GPU work by its nature includes parallel work. However, the geometry that a GPU processes includes not only sections of fully parallel work but also work that requires synchronous ordering between different sections. Accordingly, a GPU programming model that spreads sections of work on different threads is often inefficient because the parallelism is difficult to distribute across multiple different working groups and chiplets. In particular it is difficult and expensive computationally to synchronize the memory contents of shared resources throughout the entire system to provide a coherent view of the memory to applications. Additionally, from a logical point of view, applications are written with the view that the system only has a single GPU. That is, even though a conventional GPU includes many GPU cores, applications are programmed as addressing a single device. For at least these reasons, it has been historically challenging to bring chiplet design methodology to GPU architectures.

To improve system performance by using GPU chiplets without altering a relatively simple programming model, FIGS. 1-5D illustrate systems and methods of manufacturing active-bridge-coupled GPU chiplets. Currently, various architectures already have at least one level of cache (e.g., L3 or other last level cache (LLC)) that is coherent across the entire conventional GPU die. Here, the chiplet-based GPU architecture positions those physical resources (e.g., LLC) on different dies and communicably couples those physical resources such that the LLC level is unified and remains cache coherent across all GPU chiplets. Thus, although operating in a massively parallel environment, the L3 cache level is coherent. During operations, a memory address request from the CPU to the GPU is transmitted only to a single GPU chiplet, which then communicates with the active bridge chiplet to locate the requested data. From the CPU's point of view, it appears to be addressing a single die, monolithic GPU. This allows for use of a large-capacity, multi-chiplet GPU that appears as a single device to an application.

As discussed here, in various embodiments, a method of manufacture includes a face-to-face process in which a first GPU chiplet and a second GPU chiplet are bonded to a temporary carrier wafer. A face surface of an active bridge chiplet is bonded to a face surface of the first and second GPU chiplets before mounting the GPU chiplets to a carrier substrate. In other embodiments, a method of manufacture includes a face-to-back process in which a face surface of an active bridge chiplet is bonded to a back surface of the first and second GPU chiplets.

FIG. 1 is a block diagram illustrating a processing system 100 employing an active bridge chiplet for coupling GPU chiplets in accordance with some embodiments. In the depicted example, the system 100 includes a central processing unit (CPU) 102 for executing instructions and an array 104 of one or more GPU chiplets, such as the three illustrated GPU chiplets 106-1, 106-2, and through 106-N (collectively, GPU chiplets 106). In various embodiments, and as used herein, the term "chiplet" refers to any device including, but is not limited to, the following characteristics: 1) a chiplet includes an active silicon die containing at least a portion of the computational logic used to solve a full problem (i.e., the computational workload is distributed across multiples of these active silicon dies); 2) chiplets are packaged together as a monolithic unit on the same substrate; and 3) the programming model preserves the concept that the combination of these separate computational dies (i.e., the GPU chiplets) are a single monolithic unit (i.e., each chiplet is not exposed as a separate device to an application that uses the chiplets for processing computational workloads).

In various embodiments, the CPU 102 is connected via a bus 108 to a system memory 110, such as a dynamic random access memory (DRAM). In various embodiments, the system memory 110 can also be implemented using other types of memory including static random access memory (SRAM), nonvolatile RAM, and the like. In the illustrated embodiment, the CPU 102 communicates with the system memory 110 and also the GPU chiplet 106-1 over bus 108 that is implemented as a peripheral component interconnect (PCI) bus, PCI-E bus, or other type of bus. However, some embodiments of the system 100 includes the GPU chiplet 106-1 communicating with the CPU 102 over a direct connection or via dedicated buses, bridges, switches, routers, and the like.

As illustrated, the CPU 102 includes a number of processes, such as executing one or more application(s) 112 to generate graphic commands and a user mode driver 116 (and/or other drivers, such as a kernel mode driver). In various embodiments, the one or more applications 112 include applications that utilizes the functionality of the GPU chiplets 106, such as applications that generate work in the system 100 or an operating system (OS). In some implementations an application 112 includes one or more graphics instructions that instruct the GPU chiplets 106 to render a graphical user interface (GUI) and/or a graphics scene. For example, in some implementations, the graphics instructions include instructions that define a set of one or more graphics primitives to be rendered by the GPU chiplets 106.

In some embodiments, the application 112 utilizes a graphics application programming interface (API) 114 to invoke a user mode driver 116 (or a similar GPU driver). User mode driver 116 issues one or more commands to the array 104 of one or more GPU chiplets for rendering one or more graphics primitives into displayable graphics images. Based on the graphics instructions issued by application 112 to the user mode driver 116, the user mode driver 116 formulates one or more graphics commands that specify one or more operations for GPU chiplets to perform for rendering graphics. In some embodiments, the user mode driver 116 is a part of the application 112 running on the CPU 102. For example, in some embodiments the user mode driver 116 is part of a gaming application running on the CPU 102. Similarly, in some implementations a kernel mode driver (not shown), alone or in combination with the user mode driver 116, formulates the one or more graphics commands as part of an operating system running on the CPU 102.

In the depicted embodiment of FIG. 1, an active bridge chiplet 118 communicably couples the GPU chiplets 106 (i.e., GPU chiplets 106-1 through 106-N) to each other. Although three GPU chiplets 106 are shown in FIG. 1, the number of GPU chiplets in the chiplet array 104 is a matter of design choice and varies in other embodiments, such as described in more detail below. In various embodiments, such as discussed below in more detail with respect to FIG. 2, the active bridge chiplet 118 includes an active silicon bridge that serves as a high-bandwidth die-to-die interconnect between GPU chiplet dies. Additionally, the active bridge chiplet 118 operates as a memory crossbar with a shared, unified last level cache (LLC) to provide interchiplet communications and to route cross chiplet synchronization signals. Caches are naturally an active component (i.e., require electrical power for operations), so the memory crossbar (e.g., the active bridge chiplet 118) is active for holding those cache memories. Cache sizing is therefore configurable, as a function of the physical size of the active bridge chiplet 118, for different applications along with different chiplet configurations, and the base chiplet(s) to which the active bridge chiplet 118 (e.g., the GPU chiplets 106) is communicably coupled do not pay the cost (e.g., costs related to physical space, power constraints, and the like) of this external cache on the active bridge chiplet 118.

As a general operational overview, the CPU 102 is communicably coupled to a single GPU chiplet (i.e., GPU chiplet 106-1) through the bus 108. CPU-to-GPU transactions or communications from the CPU 102 to the array 104 of chiplets 106 is received at the GPU chiplet 106-1. Subsequently, any inter-chiplet communications are routed through the active bridge chiplet 118 as appropriate to access memory channels on other GPU chiplets 106. In this manner, the GPU chiplet-based system 100 includes GPU chiplets 106 that are addressable as a single, monolithic GPU from a software developer's perspective (e.g., the CPU 102 and any associated applications/rivers are unaware of the chiplet-based architecture), and therefore avoids requiring any chiplet-specific considerations on the part of a programmer or developer. As described in more detail below, in some embodiments a semiconductor chip including the array 104 of FIG. 1 is constructed using a face-to-face process flow or a face-to-back process flow.

It will be appreciated that in different embodiments the GPU chiplets 106 are placed in different arrangements so that the active bridge 118 supports more than two GPU chiplets. An example is illustrated at FIG. 1 as layout 111. In particular, layout 111 illustrates a top down view of an arrangement of the active bridge 118 providing an interconnect for four or more GPU chiplets in accordance with some embodiments. In the depicted example of layout 111, GPU chiplets are arranged in pairs, to form two "columns" of GPU chiplets with the active bridge 118 placed between the columns. Thus, GPU chiplet 106-2 is placed lateral to GPU chiplet 106-1, GPU 106-3 is placed below the GPU chiplet 106-1, and GPU 106-4 is placed lateral to GPU chiplet 106-3 and below GPU chiplet 106-4. The active bridge 118 is placed between the lateral pairs of GPU chiplets.

Figure 2:
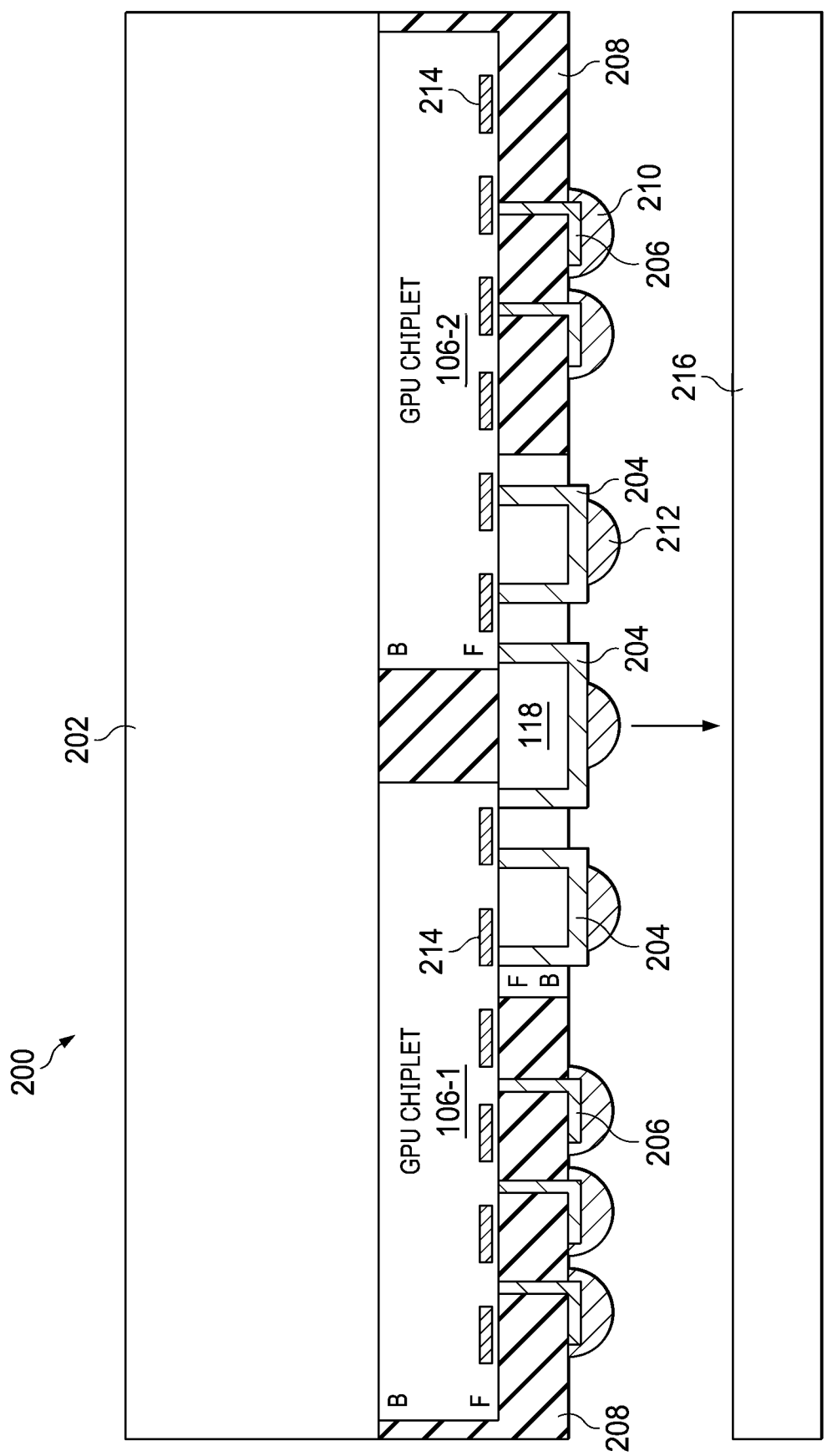
FIG. 2 is a block diagram illustrating a sectional view of GPU chiplets and active bridge chiplets in accordance with some embodiments.

Additional details of the chiplet-based architecture may be understood with reference to FIG. 2, which is a block diagram illustrating a sectional view of active-bridge-coupled GPU chiplets 200 in accordance with some embodiments. The view provides a sectional view of GPU chiplets 106-1, 106-2, and active bridge chiplet 118 of FIG. 1 along a cross section along a line illustrated in FIG. 1 as line "A". In various embodiments, each GPU chiplet 106 is constructed without any through silicon vias (TSVs). The GPU chiplets 106 are communicably coupled by way of the active bridge chiplet 118. In various embodiments, the active bridge chiplet 118 is an interconnect chip constructed of silicon, germanium or other semiconductor materials and is a bulk semiconductor, semiconductor on insulator or other designs.

The active bridge chiplet 118 includes a plurality of internal conductor traces (not shown), which in different embodiments is on a single level or multiple levels as desired. The traces interface electrically with, for example, conductor structures of the PHY regions of the GPU chiplets 106 (e.g., memory PHY 212 of FIG. 2) by way of conducting pathways. In this manner, the active bridge chiplet 118 is an active bridge die that communicably couples and routes communications between the GPU chiplets 106, thereby forming an active routing network.

As shown in FIG. 2, a carrier wafer 202 is bound to the GPU chiplets 106-1 and 106-2. In this embodiment configuration, TSVs 204 pass through the active bridge chiplet to the GPU chiplets 106 but the graphics core die(s) themselves are not constructed with any TSVs. Instead, in order to pass signal data, through dielectric vias (TDVs) 206 tunnel through a gap fill dielectric layer 208. The gap fill dielectric layer 208 (or other gap fill material) occupies areas where the bridge chiplet die and graphics core die(s) are not present (e.g., areas with vertical discrepancy between the GPU chiplets 106 and the active bridge chiplet 118). As shown, the TDVs 206 connect input/output (I/O) power of the GPU chiplets 106 down to the solder interconnects 210, which in different embodiments is a solder bump, micro bump, and the like. In this manner, the gap fill dielectric layer 208 bring both planes of the bumps on both the GPU chiplets 106 and the active bridge chiplet 118 (e.g., bump 212) into the same plane.

As described in more detail below with respect to FIG. 4, the active-bridge-coupled GPU chiplets 200 are constructed using a face-to-face process flow. That is, the active-bridge-coupled GPU chiplets 200 are oriented such that a face surface F of the GPU chiplets 106 are facing a face surface F of the active bridge chiplet. Those skilled in the art will recognize that the face surface F (also known as and interchangeably referred to as the "active surface" or the "front surface") refers to a first surface of a semiconductor die upon which active circuitry 214 (e.g., functional elements, wirings, and the like) are positioned. Similarly, the back surface B (also known as and interchangeably referred to as the "bottom surface") refers to a second surface opposite that of the face surface F on the semiconductor die.

In various embodiments, the components as illustrated in FIG. 2 interface electrically with other electrical structures, such as circuit boards or other structures, by way of interconnect structures 210 and 212 (e.g., solder balls and the like). For example, as illustrated in FIG. 2, the active-bridge-coupled GPU chiplets 200 are mounted on another device, such as circuit board 216. However, those skilled in the art will appreciate that in other embodiments various types of interconnect structures such as pins, land grid array structures, other interconnects, and the like are used without departing from the scope of this disclosure.

Figure 3:
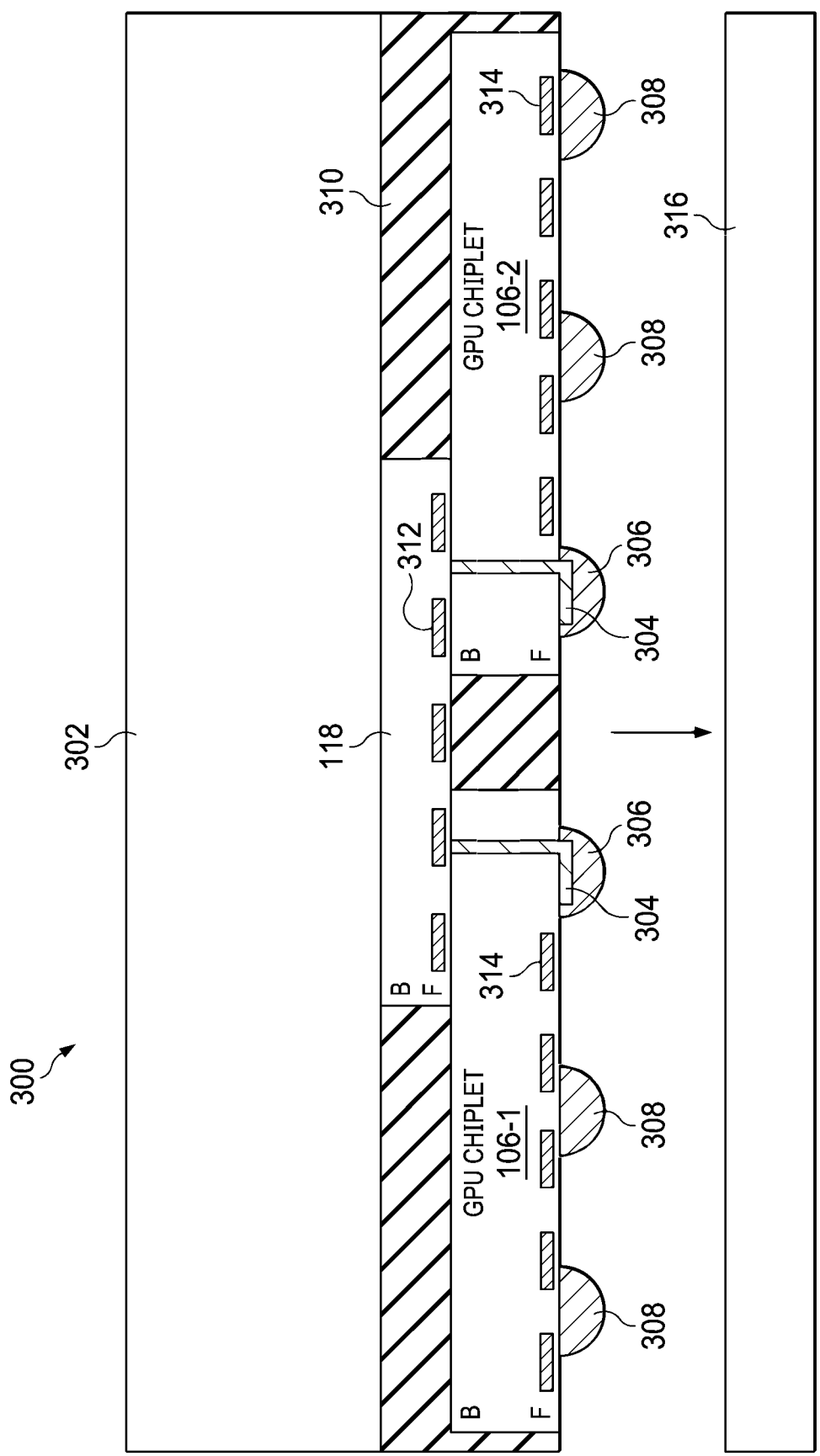
FIG. 3 is a block diagram illustrating another sectional view of GPU chiplets and active bridge chiplets in accordance with some embodiments.

FIG. 3 is a block diagram of illustrating another sectional view of active-bridge-coupled GPU chiplets 300 in accordance with some embodiments. The view provides a sectional view of GPU chiplets 106-1, 106-2, and active bridge chiplet 118 of FIG. 1 along line A. As previously noted, the GPU chiplets 106 are communicably coupled by way of the active bridge chiplet 118. In various embodiments, the active bridge chiplet 118 is an interconnect chip constructed of silicon, germanium or other semiconductor materials and is a bulk semiconductor, semiconductor on insulator or other designs.

The active bridge chiplet 118 includes a plurality of internal conductor traces (not shown), which in different embodiments is on a single level or multiple levels as desired. The traces interface electrically with, for example, conductor structures of the PHY regions of the GPU chiplets 106 (e.g., memory PHY 212 of FIG. 2) by way of conducting pathways. In this manner, the active bridge chiplet 118 is an active bridge die that communicably couples and routes communications between the GPU chiplets 106, thereby forming an active routing network.

As shown in FIG. 3, and in a manner similar to the components of FIG. 2, a carrier wafer 302 is bound to the GPU chiplets 106-1 and 106-2. However, in contrast to the embodiment of FIG. 2, each GPU chiplet 106 includes through silicon vias (TSVs) 304. In this embodiment configuration, TSVs 304 pass through the GPU chiplets 106 but the active bridge chiplet 118 itself is not constructed with any TSVs. Additionally, the active-bridge-coupled GPU chiplets also do not include any TDVs as the TSVs 304 connect input/output (I/O) power of the active bridge chiplet down to the solder interconnects 306, which in different embodiments is a solder bump, micro bump, and the like. Interconnect structures 308 electrically couple to the GPU chiplets 106. In various embodiments, a layer of dummy silicon 310 (or other gap fill material) occupies areas where the bridge chiplet die and graphics core die(s) are not present (e.g., areas with vertical discrepancy between the GPU chiplets 106 and the active bridge chiplet 118). In this manner, the layer of dummy silicon 310 bring both interconnect bumps associated with communicably and electrically coupling the GPU chiplets 106 and the active bridge chiplet 118 into the same plane and to form a monolithic chip.

As described in more detail below with respect to FIG. 5, the active-bridge-coupled GPU chiplets 300 are constructed using a face-to-back process flow. In particular, the active-bridge-coupled GPU chiplets 200 are oriented such that a face surface F of the active bridge 118 is facing a back surface B of the GPU chiplets 106. Those skilled in the art will recognize that the face surface F (also known as and interchangeably referred to as the "active surface" or the "front surface") refers to a first surface of a semiconductor die upon which active circuitry 312 and 314 (e.g., functional elements, wirings, and the like) are positioned. Similarly, the back surface B (also known as and interchangeably referred to as the "bottom surface") refers to a second surface opposite that of the face surface F on the semiconductor dies.

In various embodiments, the components as illustrated in FIG. 3 interface electrically with other electrical structure, such as circuit boards, substrates, or other structures, by way of interconnect structures 306 and 308 (e.g., solder balls and the like). For example, as illustrated in FIG. 3, the active-bridge-coupled GPU chiplets 300 are mounted on another device, such as circuit board 316. However, those skilled in the art will appreciate that in other embodiments various types of interconnect structures such as pins, land grid array structures, other interconnects, and the like are used without departing from the scope of this disclosure.

The active bridge chiplet 118, such as described above with respect to FIGS. 1-3, thus provides communications between routing fabric of two or more dies and provides coherent L3 memory access with uniform memory access behavior (or mostly uniform memory access behavior). Those skilled in the art will recognize that the performance of a processing system generally scales linearly based on the number of GPU chiplets utilized by nature of physical duplication (e.g., as the number of GPU chiplets increases, so does the number of memory PHYs, workgroup processors (WGPs) 202, and the like).

Referring now to FIGS. 4A-4G, illustrated are block diagrams of a face-to-face process flow for fabricating active-bridge-coupled GPU chiplets (e.g., active-bridge-coupled GPU chiplets 200 of FIG. 2). Those skilled in the art will recognize that in some embodiments the active-bridge-coupled GPU chiplets described herein are fabricated as single units and in other embodiments are fabricated en masse in a wafer-like structure (e.g., a reconstituted wafer) in what amounts to a wafer level process.

Figure 4A:
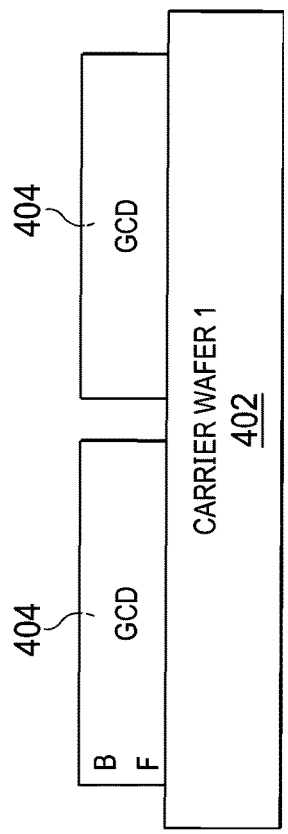
FIGS. 4A-4G are block diagrams illustrating a face-to-face process flow for fabricating active-bridge-coupled GPU chiplets in accordance with some embodiments.

At FIG. 4A, illustrated is a sectional view depicting a temporary carrier wafer 402. In various embodiments, the temporary carrier wafer 402 is constructed of glass, silicon, other types of carrier wafer materials, and the like. A plurality of known-good-dies KGDs) of graphics core dies (GCDs) 404 (e.g., GPU chiplets 106 as previously described with respect to FIGS. 1-3) are bonded to the temporary carrier wafer 402. In various embodiments, each of the graphics core dies 404 (e.g., GPU chiplets 106) is constructed without any through silicon vias (TSVs) and is also interchangeably referred to herein as a "TSV-free GCD" or a "TSV-free GPU chiplet". The bonding of FIG. 4A includes temporarily bonding a face surface F of the graphics core dies 404 to the temporary carrier wafer 402. In various embodiments, temporarily bonding the graphics core dies 404 includes using an adhesive, such as a light or heat activated adhesive, a two-sided tape, or other type of joining technique than can be subsequently undone.

Figure 4B:
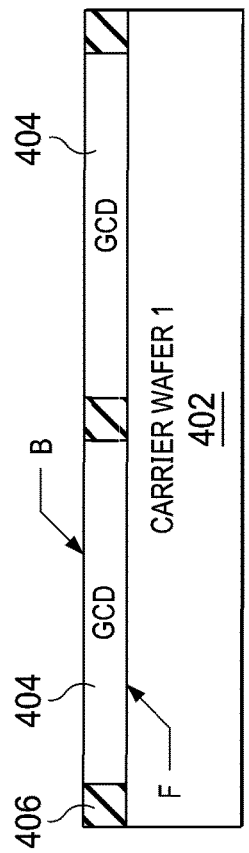

At FIG. 4B, the graphics core dies 404 of FIG. 4A are thinned and one or more gap fill dielectric layers 406 are deposited on top of the temporary carrier wafer 402. In various embodiments, the gap filling of FIG. 4B includes applying the one or more gap fill dielectric layers 406 using spin coating and baking techniques, other dielectric layer deposition techniques, and the like. Further, in various embodiments, the gap filling of FIG. 4B includes applying one or more gap fill dielectric layers 406 such as to form a planar surface by filling in areas with vertical discrepancy between the temporary carrier wafer 402 and the back surface B of the graphics core dies 404. In some embodiments, when the applying of the one or more gap fill dielectric layers 406 covers up the back surface B of the graphics core dies 404, the surface of the one or more gap fill dielectric layers 406 is subjected to a grinding process to expose the substrate portion of the back surface B of the graphics core dies 404. At this point, the combination of the graphics core dies 404 and the one or more gap fill dielectric layers 406 make up a reconstituted unit (or wafer if performed on a wafer-level basis) that is separate-able from the temporary carrier wafer 402.

Figure 4C:
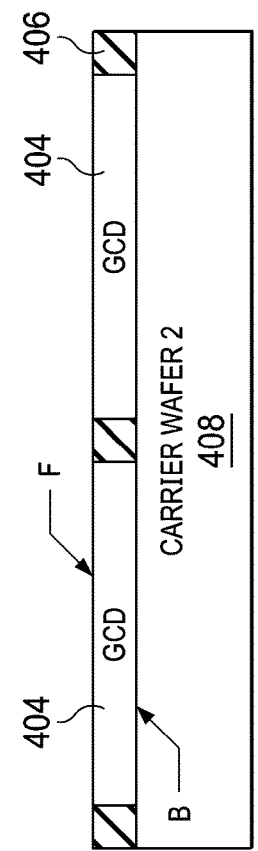

At FIG. 4C, carrier flipping is applied and the temporary carrier wafer 402 is separated from the combination of the graphics core dies 404 and the one or more gap fill dielectric layers 406. In various embodiments, the separating of FIG. 4C includes applying a process appropriate for the technique originally used to join the temporary carrier wafer 402 to the graphics core dies 404. For example, in various embodiments, the separating of FIG. 4C includes thermal release tapes or adhesives, light- or heat-activated adhesive releases, and the like. Additionally, the combination of the graphics core dies 404 and the one or more gap fill dielectric layers 406 is bonded to a second carrier wafer 408 with the back surface B of the graphics core dies 404 bonding to the second carrier wafer 408 for mechanical support. In this manner, the front surface F of the graphics core dies 404 are exposed.

Figure 4D:
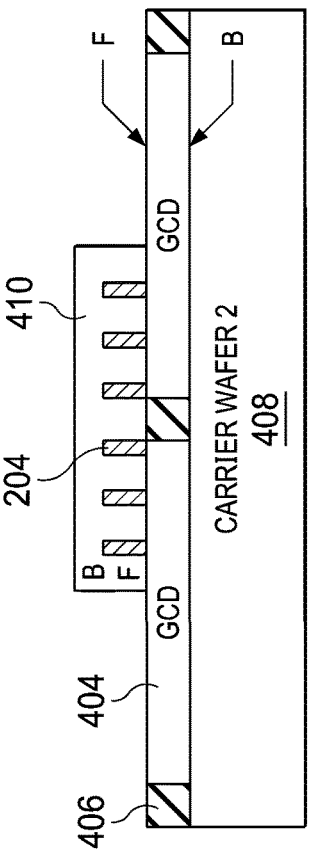

At FIG. 4D, a known-good-die of an active bridge die 410 (e.g., active bridge chiplet 118 as previously described with respect to FIGS. 1-3) is bonded to the second carrier wafer 408. The active bridge die 410 includes TSVs 204, as previously described with respect to FIG. 2. In various embodiments, the operations of FIG. 4D includes bonding a face surface F of the active bridge die 410 to a face surface F of the graphics core dies 404 (hence the "face-to-face process" term referred to herein).

Figure 4E:
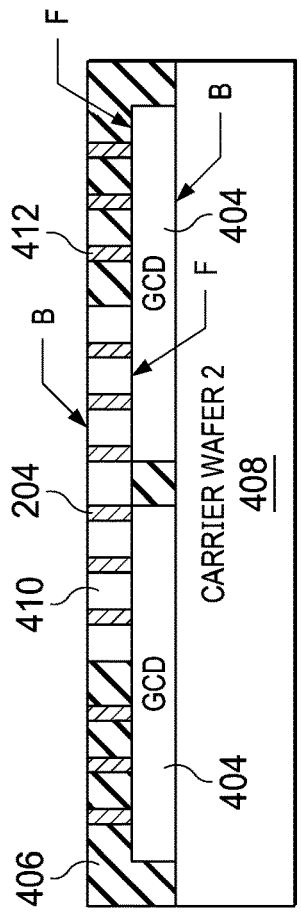

At FIG. 4E, the active bridge die 410 is thinned to expose the TSVs 204 and an additional one or more gap fill dielectric layers 406 are deposited over the graphics core dies 404 and existing gap fill dielectric layers 406 of FIGS. 4A-4D. In various embodiments, the gap filling of FIG. 4E includes applying the one or more gap fill dielectric layers 406 using spin coating and baking techniques, other dielectric layer deposition techniques, and the like. Further, in various embodiments, the gap filling of FIG. 4B includes applying one or more gap fill dielectric layers 406 such as to form a planar surface by filling in areas with vertical discrepancy between the graphics core dies 404 and the back surface B of the active bridge die 410. In some embodiments, when the applying of the one or more gap fill dielectric layers 406 covers up the back surface B of the active bridge die 410, the surface of the one or more gap fill dielectric layers 406 is subjected to a grinding process to expose the substrate portion of the back surface B of the active bridge die 410. Further, one or more through dielectric vias 412 (such as the TDVs 206 as previously described with respect to FIG. 2) are etched in the one or more gap fill dielectric layers 406 that tunnel through the one or more gap fill dielectric layers 406 down to the graphics core dies 404.

For example, in some embodiments, the one or more gap fill dielectric layers 406 are suitably masked and lithographically patterned, such as by way of photolithography to establish voids/openings to the graphics core dies 404. In various embodiments, the void(s) resulting from etching through the one or more gap fill dielectric layers 406 are filled with Copper or other material with high thermal and/or electrical conductivity to form conductive pillars (e.g., TDVs 412) that communicably couple to the graphics core dies 404.

Figure 4F:
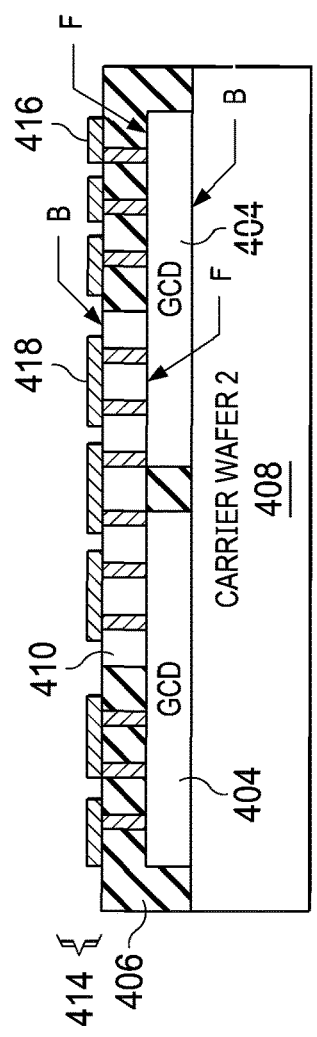

At FIG. 4F, a redistribution layer (RDL) structure 414 is fabricated at the bottom surface of the active bridge die 410 and the one or more gap fill dielectric layers 406. In various embodiments, the RDL structure 414 includes one or more conductor structures 416 that are coupled to the TDVs 412 through the gap fill dielectric layers 406 and one or more conductor structures 418 coupled to the TSVs 204 of the active bridge die 410. It will be appreciated that, in various embodiments, the RDL structure 414 is fabricated with design rules for small spaces associated with I/O mappings of the graphics core dies 404. In some embodiments, the one or more conductor structures 416 and 418 are bump pads formed by masking and plating processes to establish laterally extending conductors.

Figure 4G:
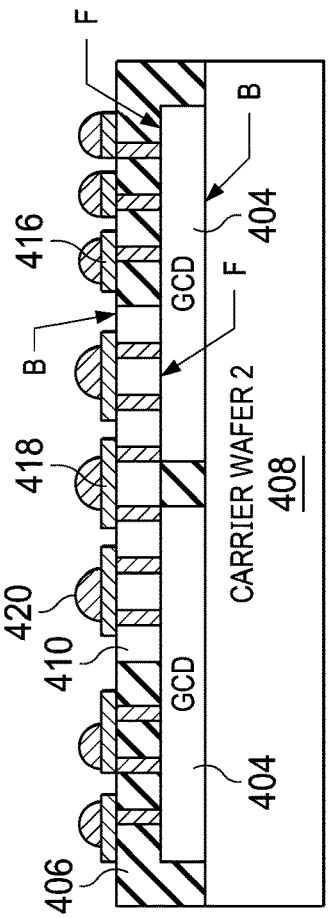

At FIG. 4G, the bumping process is completed by applying conductor bumps 420 to the one or more conductor structures 416 and 418 (e.g., bump pads) using known solder plating, pick and place, or printing and reflow techniques. At this stage, the active-bridge-coupled GPU chiplets are complete and ready to be mounted to a substrate, such as the circuit board 216 illustrated in FIG. 2.

Referring now to FIGS. 5A-5D, illustrated are block diagrams of a face-to-back process flow for fabricating active-bridge-coupled GPU chiplets (e.g., active-bridge-coupled GPU chiplets 300 of FIG. 3). Those skilled in the art will recognize that the active-bridge-coupled GPU chiplets described herein in some embodiments are fabricated as single units and in other embodiments are fabricated en masse in a wafer-like structure (e.g., a reconstituted wafer) in what amounts to a wafer level process.

Figure 5A:
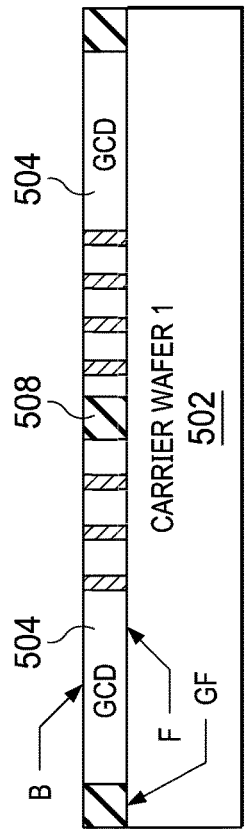
FIGS. 5A-5D are block diagrams illustrating a face-to-back process flow for fabricating active-bridge-coupled GPU chiplets in accordance with some embodiments.

At FIG. 5A, illustrated is a sectional view depicting a temporary carrier wafer 502. In various embodiments, the temporary carrier wafer 502 is constructed of glass, silicon, other types of carrier wafer materials, and the like. A plurality of known-good-dies (KGDs) of graphics core dies (GCDs) 504 (e.g., GPU chiplets 106 as previously described with respect to FIGS. 1-3) are bonded to the temporary carrier wafer 502. In various embodiments, in contrast to the embodiments of FIGS. 2 and 4A-4G, each GPU chiplet 106 includes through silicon vias (TSVs) 506. The bonding of FIG. 5A includes temporarily bonding a face surface F of the graphics core dies 504 to the temporary carrier wafer 502. In various embodiments, temporarily bonding the graphics core dies 504 includes using an adhesive, such as a light or heat activated adhesive, a two-sided tape, or other type of joining technique than can be subsequently undone.

Figure 5B:
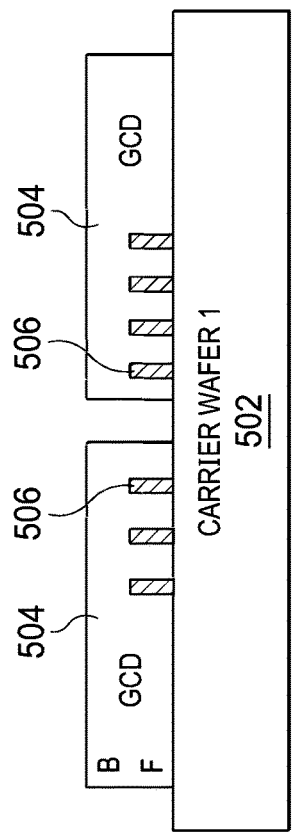

At FIG. 5B, the graphics core dies 504 of FIG. 5A are thinned to expose the TSVs 506 such that the TSVs 506 pass through the GPU chiplets 106 from a face surface F to a back surface B. Further, one or more gap fill dielectric layers 508 are deposited on top of the temporary carrier wafer 502. In various embodiments, the gap filling of FIG. 5B includes applying the one or more gap fill dielectric layers 508 using spin coating and baking techniques, other dielectric layer deposition techniques, and the like. Further, in various embodiments, the gap filling of FIG. 5B includes applying one or more gap fill dielectric layers 508 such as to form a planar surface by filling in areas with vertical discrepancy between the temporary carrier wafer 502 and the back surface B of the graphics core dies 504. In some embodiments, when the applying of the one or more gap fill dielectric layers 508 covers up the back surface B of the graphics core dies 504, the surface of the one or more gap fill dielectric layers 508 is subjected to a grinding process to expose the substrate portion of the back surface B of the graphics core dies 504. At this point, the combination of the graphics core dies 504 and the one or more gap fill dielectric layers 508 make up a reconstituted unit (or wafer if performed on a wafer-level basis) that is separate-able from the temporary carrier wafer 502.

Figure 5C:
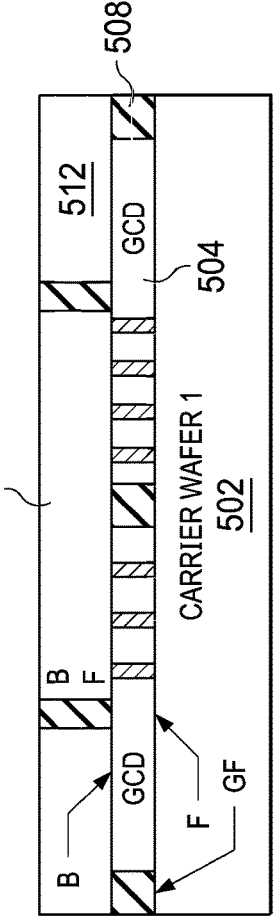

At FIG. 5C, a known-good-die of an active bridge die 510 (e.g., active bridge chiplet 118 as previously described with respect to FIGS. 1-3) is bonded to the graphics core dies 504. In various embodiments, such as previously described with respect to FIG. 3, the active bridge die 510 is constructed without any TSVs and is also interchangeably referred to herein as a "TSV-free active bridge die" or a "TSV-free active bridge chiplet". In various embodiments, the operations of FIG. 5C includes bonding a face surface F of the active bridge die 510 to a back surface B of the graphics core dies 504 (hence the "face-to-back process" term referred to herein).

Figure 5D:
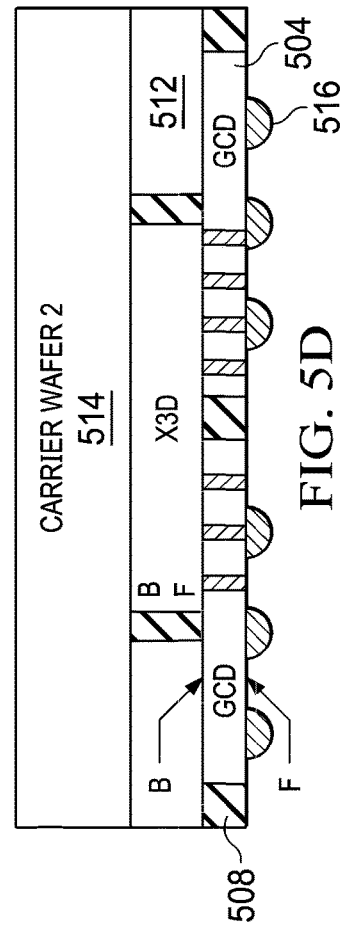

Additionally, in some embodiments, the operations of FIG. 5C include depositing one or more layers of dummy silicon 512 on top of the graphics core dies 504 and existing one or more gap fill dielectric layers 508. With reference to FIG. 5D below, the one or more layers of dummy silicon 512 provide structural integrity for the reconstituted unit after binding to the second carrier wafer 514. The one or more layers of dummy silicon 512 improve thermal performance by conducting heat away the graphics core dies 504 during operation. In other embodiments, an additional one or more layers of gap fill dielectric are deposited instead of the one or more layers of dummy silicon 512.

At FIG. 5D, carrier flipping is applied and the temporary carrier wafer 502 is separated from the combination of the graphics core dies 504, the one or more gap fill dielectric layers 508, and the one or more layers of dummy silicon 512. In various embodiments, the separating of FIG. 5D includes applying a process appropriate for the technique originally used to join the temporary carrier wafer 502 to the graphics core dies 504. For example, in various embodiments, the separating of FIG. 5D includes thermal release tapes or adhesives, light- or heat-activated adhesive releases, and the like. Additionally, the combination of the graphics core dies 504, the one or more gap fill dielectric layers 508, and the one or more layers of dummy silicon 512 is bonded to a second carrier wafer 514 with the back surface B of the active bridge die 510 bonding to the second carrier wafer 514 for mechanical support. In this manner, the front surface F of the graphics core dies 504 are exposed. Additionally, the bumping process is completed by applying conductor bumps 516 to the face surface F of the graphics core dies 504 using known solder plating, pick and place, or printing and reflow techniques. At this stage, the active-bridge-coupled GPU chiplets are complete and ready to be mounted to a substrate, such as the circuit board 316 illustrated in FIG. 3.

Those skilled in the art will recognize that although FIGS. 1-5D are described here in the specific context of a rectangular active bridge chiplet die 118 spanning across the middle of two or three GPU chiplets, various other configurations, die shapes, and in other embodiments different geometries are utilized without departing from the scope of this disclosure. For example, in some embodiments, GPU chiplets are fabricated to include active bridge chiplets at one or more corners of a square GPU chiplet such that multiple GPU chiplets are tiled together in a chiplet array. Similarly, in other embodiments, GPU chiplets are fabricated to include active bridge chiplets spanning an entire side of a GPU chiplet such that multiple GPU chiplets are strung together in a long row/column configuration with an intervening active bridge chiplet.

Accordingly, as discussed herein, an active bridge chiplet deploys monolithic GPU functionality using a set of interconnected GPU chiplets in a manner that makes the GPU chiplet implementation appear as a traditional monolithic GPU from a programmer model/developer perspective. The scalable data fabric of one GPU chiplet is able to access the lower level cache(s) on the active bridge chiplet in nearly the same time as to access the lower level cache on its same chiplet, and thus allows the GPU chiplets to maintain cache coherency without requiring additional inter-chiplet coherency protocols. This low-latency, inter-chiplet cache coherency in turn enables the chiplet-based system to operate as a monolithic GPU from the software developer's perspective, and thus avoids chiplet-specific considerations on the part of a programmer or developer.

A computer readable storage medium may include any non-transitory storage medium, or combination of non-transitory storage media, accessible by a computer system during use to provide instructions and/or data to the computer system. Such storage media can include, but is not limited to, optical media (e.g., compact disc (CD), digital versatile disc (DVD), Blu-Ray disc), magnetic media (e.g., floppy disc, magnetic tape, or magnetic hard drive), volatile memory (e.g., random access memory (RAM) or cache), non-volatile memory (e.g., read-only memory (ROM) or Flash memory), or microelectromechanical systems (MEMS)-based storage media. The computer readable storage medium may be embedded in the computing system (e.g., system RAM or ROM), fixedly attached to the computing system (e.g., a magnetic hard drive), removably attached to the computing system (e.g., an optical disc or Universal Serial Bus (USB)-based Flash memory), or coupled to the computer system via a wired or wireless network (e.g., network accessible storage (NAS)).

In some embodiments, certain aspects of the techniques described above are implemented by one or more processors of a processing system executing software. The software includes one or more sets of executable instructions stored or otherwise tangibly embodied on a non-transitory computer readable storage medium. The software can include the instructions and certain data that, when executed by the one or more processors, manipulate the one or more processors to perform one or more aspects of the techniques described above. The non-transitory computer readable storage medium can include, for example, a magnetic or optical disk storage device, solid state storage devices such as Flash memory, a cache, random access memory (RAM) or other non-volatile memory device or devices, and the like. The executable instructions stored on the non-transitory computer readable storage medium are in source code, assembly language code, object code, or other instruction format that is interpreted or otherwise executable by one or more processors.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. A method of forming active-bridge-coupled GPU chiplets, comprising:
   bonding a first GPU chiplet and a second GPU chiplet to a temporary carrier wafer;
   bonding a face surface of an active bridge chiplet to a face surface of the first and second GPU chiplets, wherein the active bridge chiplet includes a level of cache memory and wherein the active bridge chiplet is configured to communicatively couple the level of cache memory to the first and second GPU chiplets such that the level of cache memory is cache coherent across the first and second GPU chiplets; and
   mounting the first and second GPU chiplets to a carrier substrate.

2. The method of claim 1, wherein bonding the first GPU chiplet and the second GPU chiplet to the temporary carrier wafer comprises bonding the face surface of the first and second GPU chiplets to the temporary carrier wafer.

3. The method of claim 2, further comprising:
   depositing one or more gap fill dielectric layers on top of the temporary carrier wafer.

4. The method of claim 3, wherein depositing one or more gap fill dielectric layers on top of the temporary carrier wafer includes forming a planar surface by filling in areas with a vertical discrepancy between a surface of the temporary carrier wafer and a back surface of the first and second GPU chiplets.

5. The method of claim 3, further comprising:
   performing carrier flipping by separating the face surface of the first and second GPU chiplets from the temporary carrier wafer; and
   bonding a back surface of the first and second GPU chiplets to a second carrier wafer.

6. The method of claim 5, further comprising:
   etching one or more voids through an additional one or more gap fill dielectric layers; and
   filling the one or more voids with a conductive material to form a set of conductive pillars that communicably couple to at least one of the first and second GPU chiplets.

7. The method of claim 6, wherein the set of conductive pillars comprise through dielectric vias.

8. The method of claim 6, further comprising:
   fabricating a redistribution layer structure at a back surface of the active bridge chiplet.

9. The method of claim 8, wherein fabricating the redistribution layer structure further comprises positioning a conductor structure on top of each of the set of conductive pillars.

10. The method of claim 1, further comprising:
    thinning, subsequent to bonding the face surface of the active bridge chiplet to the face surface of the first and second GPU chiplets, the active bridge chiplet to expose a set of through silicon vias (TSVs) extending from the face surface of the active bridge chiplet to a back surface opposite the face surface of the active bridge chiplet.

11. A method of forming an active-bridge-coupled GPU chiplet unit, comprising:
    bonding a first GPU chiplet and a second GPU chiplet to a temporary carrier wafer;
    bonding a face surface of an active bridge chiplet to a back surface of the first and second GPU chiplets, wherein the active bridge chiplet includes a level of cache memory and wherein the active bridge chiplet is configured to communicatively couple the level of cache memory to the first and second GPU chiplets such that the level of cache memory is cache coherent across the first and second GPU chiplets; and
    mounting the active-bridge-coupled GPU chiplet unit including the first and second GPU chiplets to a carrier substrate.

12. The method of claim 11, further comprising:
    thinning the first and second GPU chiplets to expose a set of through silicon vias (TSVs) extending from a face surface to the back surface opposite the face surface of the first and second GPU chiplets.

13. The method of claim 11, wherein bonding the first GPU chiplet and the second GPU chiplet to the temporary carrier wafer comprises bonding a face surface of the first and second GPU chiplets to the temporary carrier wafer.

14. The method of claim 13, further comprising:
    depositing one or more gap fill dielectric layers on top of the temporary carrier wafer to form a planar surface by filling in areas with a vertical discrepancy between a surface of the temporary carrier wafer and a back surface of the first and second GPU chiplets.

15. The method of claim 14, further comprising:
    performing carrier flipping by separating the face surface of the first and second GPU chiplets from the temporary carrier wafer; and
    bonding a back surface of the active bridge chiplet to a second carrier wafer.

16. The method of claim 15, further comprising:
    attaching one or more layers of dummy silicon between the second carrier wafer and a back surface of first and second GPU chiplets.

17. The method of claim 11, further comprising:
    coupling one or more conductor structures to a face surface of the first and second GPU chiplets.

18. A processor formed by a method of forming active-bridge-coupled GPU chiplets, the method comprising:

bonding a first GPU chiplet and a second GPU chiplet to a temporary carrier wafer;

bonding a face surface of an active bridge chiplet to a face surface of the first and second GPU chiplets, wherein the active bridge chiplet includes a level of cache memory and wherein the active bridge chiplet is configured to communicatively couple the level of cache memory to the first and second GPU chiplets such that the level of cache memory is cache coherent across the first and second GPU chiplets; and mounting the first and second GPU chiplets to a carrier substrate.

19. The processor of claim 18, wherein bonding the first GPU chiplet and the second GPU chiplet to the temporary carrier wafer comprises bonding the face surface of the first and second GPU chiplets to the temporary carrier wafer.

* * * * *